(12) United States Patent
Hakkal et al.

(10) Patent No.: US 6,404,240 B1
(45) Date of Patent: Jun. 11, 2002

(54) CIRCUIT AND METHOD OF A THREE STATE PHASE FREQUENCY LOCK DETECTOR

(75) Inventors: Harsha Sharath Hakkal, Tempe; Joseph Jason Hughes, Gilbert, both of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/699,104

(22) Filed: Oct. 30, 2000

(51) Int. Cl.[7] .............................................. H03D 13/00
(52) U.S. Cl. .............................. 327/12; 327/47; 327/49
(58) Field of Search .............................. 327/2, 3, 7, 12, 327/155, 156, 158, 159, 161–163, 47, 49

(56) References Cited

U.S. PATENT DOCUMENTS

| | | | | |
|---|---|---|---|---|
| 3,936,758 A | * | 2/1976 | Kostelnicek et al. ............ 327/3 |
| 4,480,198 A | * | 10/1984 | Gass ........................... 327/292 |
| 5,159,279 A | * | 10/1992 | Shenoi et al. ................... 327/23 |
| 5,459,765 A | * | 10/1995 | Meyer et al. ................... 327/23 |
| 5,568,072 A | * | 10/1996 | Schoellkopf ................. 327/146 |
| 5,740,211 A | * | 4/1998 | Bedrosian .................... 327/147 |

OTHER PUBLICATIONS

R. C. Den Dulk, "Digital PLL Lock–Detection Circuit" Jul. 7, 1988 Electronics Letters vol. 24 No. 14.

* cited by examiner

Primary Examiner—Kenneth B. Wells

(57) ABSTRACT

A three state phase frequency lock detector (14) is provided which monitors the UP and DOWN phase pulses generated by a three state phase frequency detector (PFD). The lock detector (14) asserts the lock detect signal when the rising edges of the UP and DOWN phase pulses are phase aligned and un-asserts the lock detect signal for all other relative phases of the UP and DOWN phase pulses. Lock detector (14) is capable of reporting the lock detect signal for each cycle of the UP and DOWN pulses.

13 Claims, 5 Drawing Sheets

CIRCUIT AND METHOD OF A THREE STATE PHASE FREQUENCY LOCK DETECTOR

FIELD OF THE INVENTION

The present invention relates to phase and frequency lock detection circuits, and more particularly, to three state phase frequency lock detectors.

BACKGROUND OF THE INVENTION

Phase-lock loops (PLL'S) and their associated phase lock detection circuits are widely used in modern communications systems, telemetry, timing and frequency control and instrumentation systems. PLL's are critical for communication applications where the frequency and phase of the transmitted carrier frequency contain the information to be communicated. Accordingly, providing a method whereby phase and frequency errors within the transmission carrier can be minimized is desirable. Phase coherent and frequency coherent communication systems, utilizing PLL's to maintain phase and frequency coherency, is one method which can be utilized to minimize communication errors.

Three state phase and frequency detectors (PFD's) provide a method of frequency and phase control whereby phase pulses are used to provide instantaneous phase information about the positive and negative phase error between a reference signal and a feedback signal. Positive phase pulses, or UP pulses, provided by the PFD indicate that the phase of the feedback signal must be advanced relative to the reference signal. Negative phase pulses, or DOWN pulses, provided by the PFD indicate that the phase of the feedback signal must be retarded relative to the reference signal. Three state lock detection circuits use the information provided by the UP and DOWN pulses to provide a lock detect signal. The lock detect signal provides information about the state of the PLL, which can be used to control the bandwidth of the PLL.

Prior art three state lock detection circuits provide information about the lock state of the PLL, however, the information is generally not available instantaneously. In general, prior art lock detection circuits lag the actual state of the PLL by several cycles. In other words, lock detect indications provided by prior art lock detection circuits are not real time. In addition, prior art lock detection circuits are severely limited by high frequency applications. Prior art lock detection circuits generally operate in the tens to hundreds of megahertz, whereas, current technology trends are demanding gigahertz operation.

A need exists, therefore, for lock detect circuits operating in combination with three state phase frequency detectors to provide near real time lock detect information at gigahertz operating speeds.

DETAILED DESCRIPTION OF THE DRAWINGS

Figure 1:
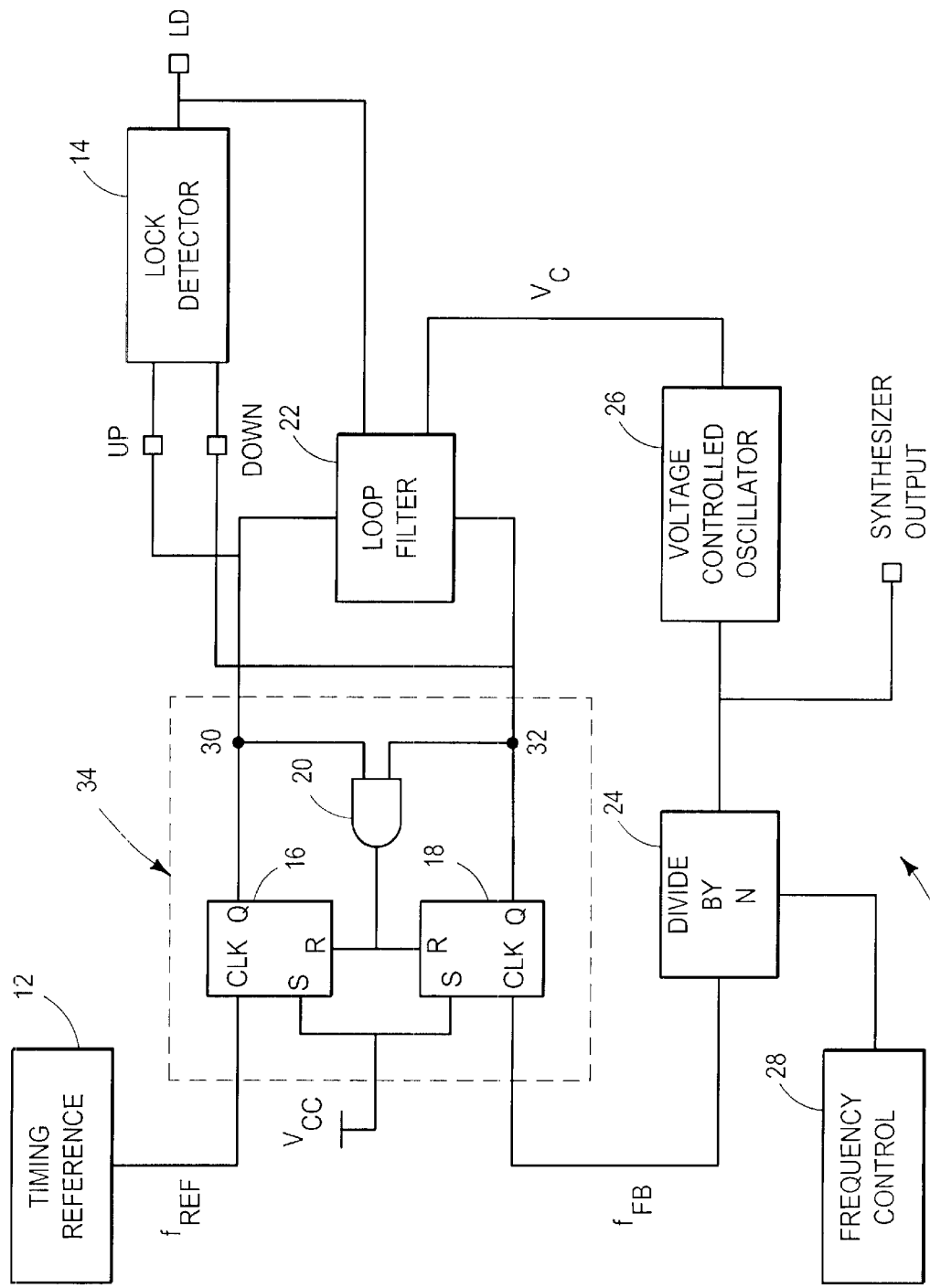
FIG. 1 is a synthesizer application for a phase-lock loop utilizing a three state phase frequency detector in combination with a lock detection circuit.

FIG. 1 illustrates a frequency synthesizer 10 providing a digital PLL control loop which utilizes a three state phase frequency detector (PFD) 34 implemented by flip flops 16 and 18 in combination with AND gate 20. Frequency synthesizer 10 provides lock detector 14 which receives UP and DOWN phase pulses from PFD 34 to provide lock status of the PLL. Lock detection circuit 14 can be implemented as an integrated circuit (IC) having 3 pins. First and second pins are coupled to receive phase pulses from PFD 34 and the third pin is coupled to provide a lock detection status of the PLL. Frequency synthesizer 10 receives frequency programming information from frequency control 28. Frequency control 28 programs the divisor N of the quotient $f_{FB}$ set by $f_{FB}=f_{OUT}/N$, where $f_{OUT}$ is the synthesizer output frequency and N is the integer valued divisor set by divide by N block 24. The synthesizer output frequency, $f_{OUT}$ is, for example, programmed for operation from 1 to 2 gigahertz (Ghz) in 100 MHz steps. In other words, the synthesizer output frequency, $f_{OUT}$, is programmed to 1.0, 1.1, 1.2 . . . 2 GHz by appropriate selection of N. Timing reference 12 is, for example, set to a fixed frequency of 100 MHz. Comparison of the timing reference signal and the feedback signal by the PFD must, therefore, take place at the fixed timing frequency, set by timing reference 12, of 100 MHz. Providing an output frequency $f_{OUT}$, of 1.2 GHz, for example, requires that the divide by N divisor be programmed to 12, since $f_{FB}=1.2$ GHz/12=100 MHz. At 2 Ghz operation, for example, the divisor N is programmed to 20 since $f_{FB}=2$ GHz/20=100 MHz.

Voltage controlled oscillator (VCO) 26 receives error information represented by voltage $V_c$ from loop filter 22. VCO 26 provides an output signal which oscillates at a frequency directly proportional to the input voltage, $V_c$, which is defined to be the loop error voltage generated by the PLL. Typically, VCO's have a range of operation which is substantially linear relative to the loop error voltage, $V_c$. The VCO gain term expressed in $H_z$/volt, in other words, provides a linear output frequency curve with respect to the loop error voltage, $V_c$, applied to a control terminal of the VCO. VCO 26, for example, can operate over a loop error voltage range between 3–5 volts, where the output frequency of VCO 26 is 1 GHz given a loop error voltage of 3 volts and the output frequency of VCO 26 is 2 GHz given a loop error voltage of 5 volts. In normal operation, for example, synthesizer 10 provides output frequencies between 1 and 2 GHz where the loop error voltage ranges from 3–5 volts, respectively.

Loop filter 22 receives positive and negative pulse information from PFD 34, which characterizes the operation of loop filter 22 as a digitally implemented loop filter. UP and DOWN pulse information from PFD 34 is presented at nodes 30 and 32, respectively. Positive phase pulses, or UP pulses, provided by PFD 34, indicate that the phase of the feedback signal must be advanced relative to the reference signal. Negative phase pulses, or DOWN pulses, provided by PFD 34, indicate that the phase of the feedback signal must be retarded relative to the reference signal. Loop filter 22 internally provides a charge pump, which receives the UP and DOWN pulses and converts them into loop error voltage, $V_c$. $V_c$, as discussed before, determines the output frequency of VCO 26. Loop filter 22 contributes to the loop gain of the PLL used to control synthesizer 10. Loop gain, or transfer function, of the PLL determines loop characteristics such as frequency acquisition bandwidth, frequency tracking bandwidth and frequency lock time. Controlling the gain of loop filter 22, and subsequently controlling the loop gain of the PLL, is a key function of lock detector 14. By monitoring the lock detect signal from lock detector 14, loop filter 22 may dynamically change the loop gain of the PLL such that undershoot and overshoot of the loop error voltage, $V_c$, can be controlled. Loop filter 22 can, for example, upon receiving an asserted lock detect signal from lock detector 14, reduce the current produced by the internal charge pump. Assume, for example, the internal charge pump of loop filter 22 produces 100 microamps (uA) of current when the lock detect signal is un-asserted and the charge pump produces 50 uA of current when the lock detect signal is asserted. The error voltage, $V_c$, produced by the charge pump, therefore, is reduced by half when the lock detect signal is reporting a lock condition. Reducing the current produced by the internal charge pump reduces the magnitude of the error voltage, $V_c$, which effectively reduces the gain of the loop filter. PLL loop operation can be modified by loop filter 22 by monitoring the behavior of lock detect signal from lock detector 14. Loop gain of the PLL, for example, is set high when the PLL is in acquisition mode to meet frequency acquisition bandwidth specifications, corresponding to a 100 uA charge pump drive. Upon asserting the lock detect signal, for example, the loop gain of the PLL can be lowered to a value such that the loop error voltage ringing is minimized during acquisition, corresponding to a 50 uA charge pump drive. Adjusting the loop gain of the PLL during acquisition provides a method whereby the damping factor of the PLL is optimally set by the dynamic gain variation of loop filter 22 resulting in an optimally stabilized operation of frequency synthesizer 10.

PFD 34 receives the reference timing signal, $f_{REF}$, from timing reference 12 at the CLK input to flip flop 16 and receives the feedback signal, $f_{FB}$, from divide by N block 24 at the CLK input of flip flop 18. The set inputs to flip flops 16 and 18 are hardwired to a logic high voltage by coupling the inputs to $V_{cc}$. Positive phase pulses, or UP pulses, are generated by PFD 34 relative to the phase difference between $f_{REF}$ and $f_{FB}$. Maximal width UP pulses are generated by flip flop 16 at node 30, when the phase of the feedback signal $f_{FB}$ lags the phase of the reference signal $f_{REF}$ by the maximum value, $\theta_{max}=2\pi$ radians. Maximal width DOWN pulses are generated by flip flop 18 at node 32, when the phase of the reference signal $f_{REF}$ lags the phase of the feedback signal $f_{FB}$ by the maximum value, $\theta_{max}=2\pi$ radians. Minimal length UP and DOWN pulses, substantially equal to the propagation delay of AND gate 20, are generated by flip flop 16 and 18, respectively, when the reference signal and the feedback signal are in substantially perfect phase alignment.

Figure 2:
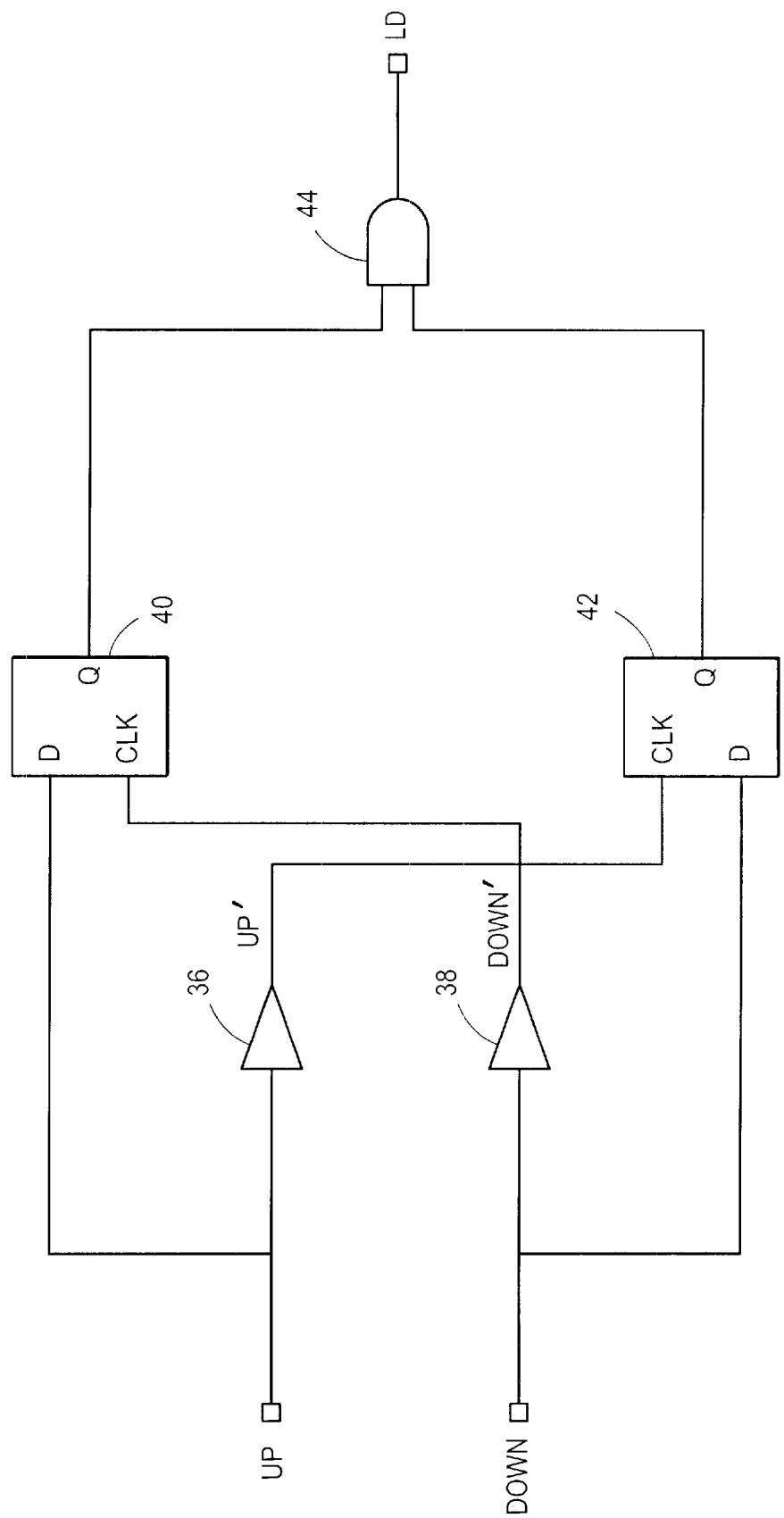
FIG. 2 is a detailed schematic of the lock detection circuit illustrated in FIG. 2.

FIG. 2 illustrates a detailed schematic of lock detector 14. UP pulses are received at terminal UP and are coupled to the input of buffer 36 and to the D input of flip flop 40. DOWN pulses are coupled to the input of buffer 38 and to the D input of flip flop 42. The output of buffer 36, UP', is coupled to the CLK input of flip flop 42. The output of buffer 38, DOWN', is coupled to the CLK input of flip flop 40. The Q outputs of flip flop 40 and 42 are coupled to the inputs of AND gate 44. The output of AND gate 44 is coupled to the LD terminal of lock detector 14. Flip flops 40 and 42 are positive edge triggered D flip flops, meaning that a positive edge on the CLK input to flip flops 40 and 42 results in transferring data present at the D input to the Q output.

In operation, PFD 34 and lock detect 14 function within three relative phase zones. Zone 1 defines an operating condition where the phase of the reference signal, $f_{REF}$, leads the phase of the feedback signal, $f_{REF}$, requiring the feedback signal phase to be retarded relative to the reference signal. Phase 3 defines an operating condition where the phase of the reference signal, $f_{REF}$, and the phase of the feedback signal, $f_{FB}$, are substantially in phase alignment.

Figure 3:
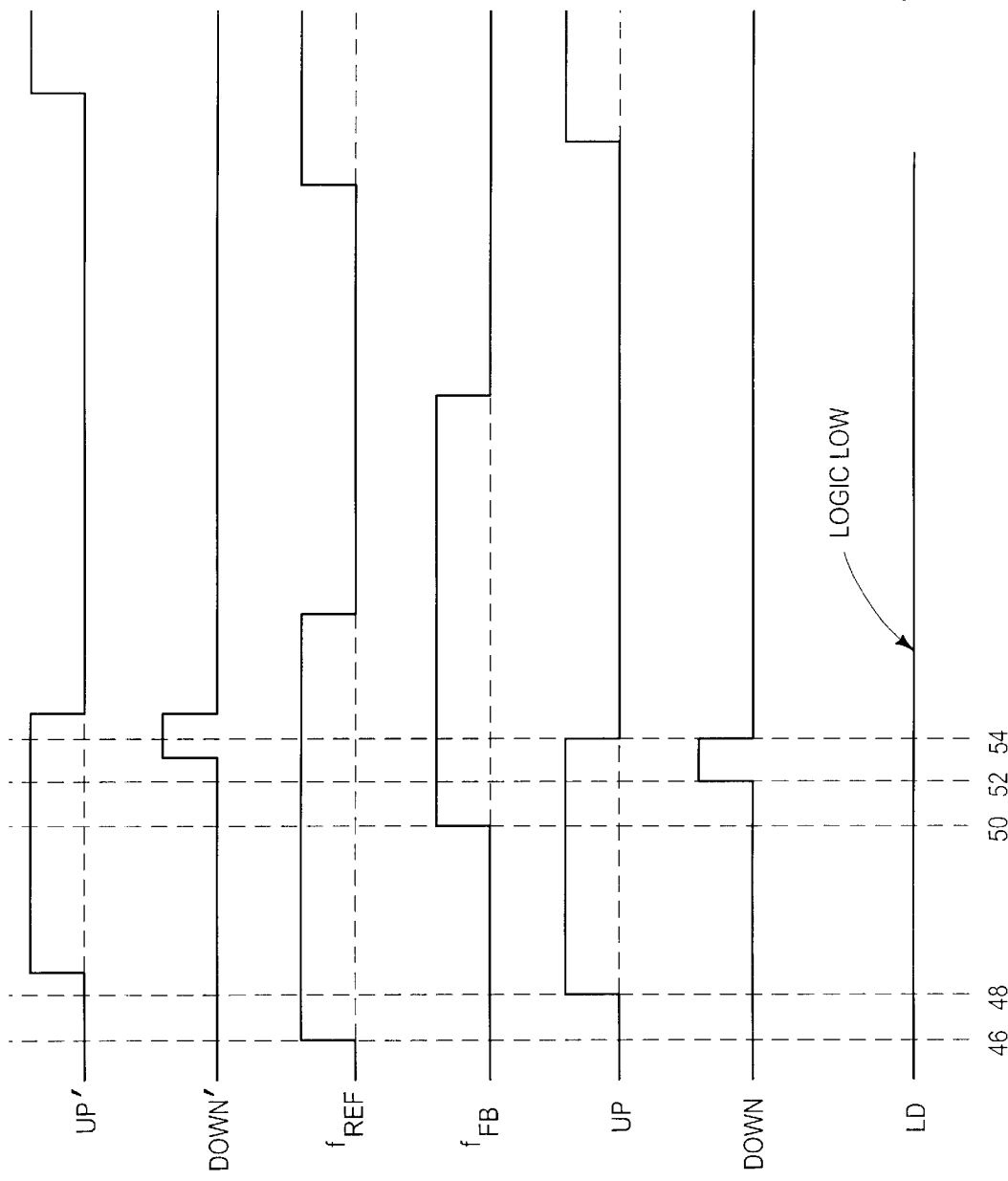
FIG. 3 is a timing diagram depicting a lock detect state of an out of lock PLL having a lagging feedback signal.

The zone 1 timing diagram is illustrated in FIG. 3. The rising edge of $f_{REF}$ occurs at time 46. The phase of $f_{FB}$ is lagging behind $f_{REF}$ such that the rising edge of $f_{FB}$ occurs at time 50. The rising edge of the UP pulse occurs at time 48 when accounting for the propagation delay through flip flop 16. Likewise, accounting for the propagation delay through asynchronous flip flop 18, the CLK input to flip flop 18 asserts the Q output, DOWN pulse, of flip flop 18 at time 52 as shown in FIG. 3. The propagation delay of AND gate 20 is considered at time 54. The difference between time 52 and time 54 depicts the propagation delay through AND gate 20. Since both inputs to AND gate 20, UP pulse and DOWN pulse, are high at time 52, the output of AND gate 20 transitions to a logic high, one propagation delay after time 52 at time 54. The outputs of flip flop 16 and 18 reset to a logic low at time 54, due to the output of AND gate 20 transitioning to a logic high at time 52 and resetting the output of flip flops 16 and 18. The reset propagation delay through flip flops 16 and 18 is neglected.

The UP pulse is applied to the D input of flip flop 40 and the input of buffer 36 at terminal UP. The DOWN pulse is applied to the D input to flip flop 42 and the input to buffer 38 at terminal DOWN. Buffer 38 receives the DOWN pulse and applies the DOWN' pulse to the CLK input of flip flop 40, one buffer delay later. The function of buffer 38 is to provide a fixed amount of delay such that the rising edge of the CLK pulse at flip flop 40 occurs after the data at the D input of flip flop 40 has been asserted and is stable. Depending on implementation, buffer 38 may not be necessary, since the timing relationship between the D input and CLK input of flip flop 40 can be guaranteed by other means. Referring to FIG. 3, the UP pulse at the D input to flip flop 40 is asserted well before the DOWN' pulse arrives at the CLK input to flip flop 40 and remains asserted long enough to be clocked through flip flop 40 to the Q output. The Q output of flip flop 40 sets the first input to AND gate 44 to a logic high potential.

Buffer 36 receives the UP pulse and applies the UP' pulse to the CLK input of flip flop 42, one buffer delay later. The function of buffer 36 is to provide a fixed amount of delay such that the rising edge of the CLK pulse at flip flop 42 occurs after the data at the D input of flip flop 42 has been asserted and is stable. Depending on implementation, buffer 36 may not be necessary, since the timing relationship between the D input and CLK input of flip flop 42 can be guaranteed by other means. Referring to FIG. 3, the DOWN' pulse has not been asserted at the D input of flip flop 42 at time 48 before the rising edge of the CLK input to flip flop 42. The output of flip flop 42 is, therefore, a logic low which sets the second input to AND gate 44 to a logic low. The output of AND gate 44 is therefore at a logic low, providing an un-asserted lock detect signal at terminal LD. A similar analysis of all timing relationships depicting the phase of $f_{REF}$ leading the phase of $f_{FB}$ yields an un-asserted lock detect signal at terminal LD for zone 1.

Figure 4:
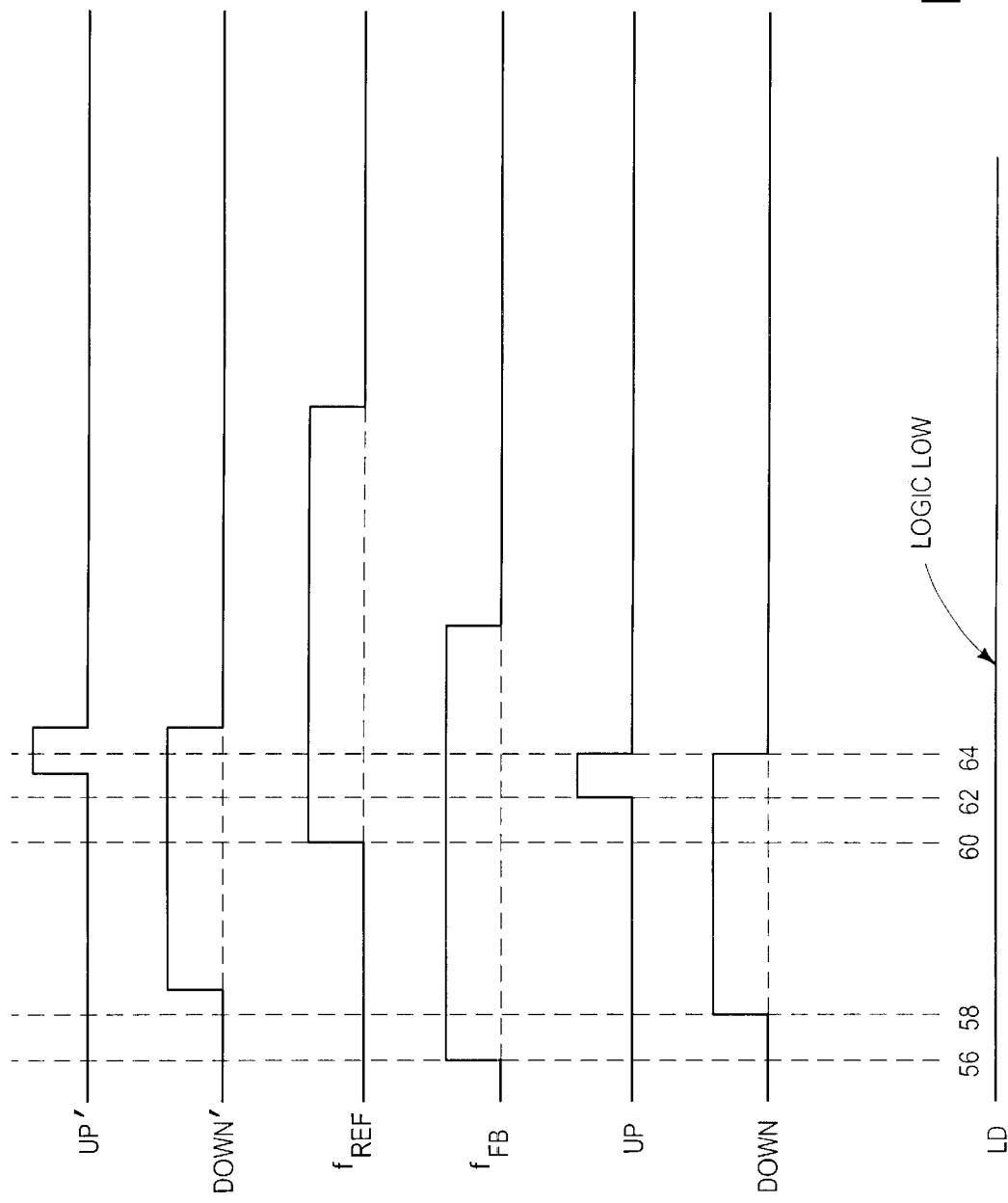
FIG. 4 is a timing diagram depicting a lock detect state of an out of lock PLL having a leading feedback signal.

The zone 2 timing diagram is illustrated in FIG. 4. The rising edge of $f_{FB}$ occurs at time 56. The phase of $f_{REF}$ is lagging behind fFBsuch that the rising edge of $f_{REF}$ occurs at time 60. The rising edge of the DOWN pulse occurs at time 58 when accounting for the propagation delay through flip flop 18. Accounting for the propagation delay through flip flop 18, the rising edge of the CLK input to flip flop 18 asserts the Q output, DOWN pulse, of flip flop 18 at time 58 as shown in FIG. 4. Likewise, accounting for the propagation delay through asynchronous flip flop 16, the CLK input to flip flop 16 asserts the Q output, UP pulse, of flip flop 16 at time 62 as shown in FIG. 4. The propagation delay of AND gate 20 is considered at time 64. The difference between time 62 and time 64 depicts the propagation delay through AND gate 20. Since both inputs to AND gate 20, UP pulse and DOWN pulse, are high at time 62, the output of AND gate 20 transitions to a logic high, one propagation delay after time 62 at time 64. The outputs of flip flop 16 and 18 transition to a logic low at time 64, due to the output of AND gate 20 transitioning to a logic high at time 64 and resetting the output of flip flops 16 and 18. The reset propagation delay through flip flops 16 and 18 is neglected.

Referring to FIG. 4, the DOWN pulse at the D input to flip flop 42 is asserted well before the UP' pulse arrives at the CLK input to flip flop 42 and remains asserted long enough to be clocked through flip flop 42 to the Q output. The Q output of flip flop 42 sets the first input to AND gate 44 to a logic high potential.

Referring to FIG. 4, the UP pulse has not been asserted at the D input of flip flop 40 before the rising edge of the CLK input to flip flop 40. The output of flip flop 40 is, therefore, a logic low which sets the second input to AND gate 44 to a logic low. The output of AND gate 44 is therefore at a logic low, providing an un-asserted lock detect signal at terminal LD. A similar analysis of all timing relationships depicting the phase of $f_{FB}$ leading the phase of $f_{REF}$ yields an un-asserted lock detect signal at terminal LD for zone 2.

Figure 5:
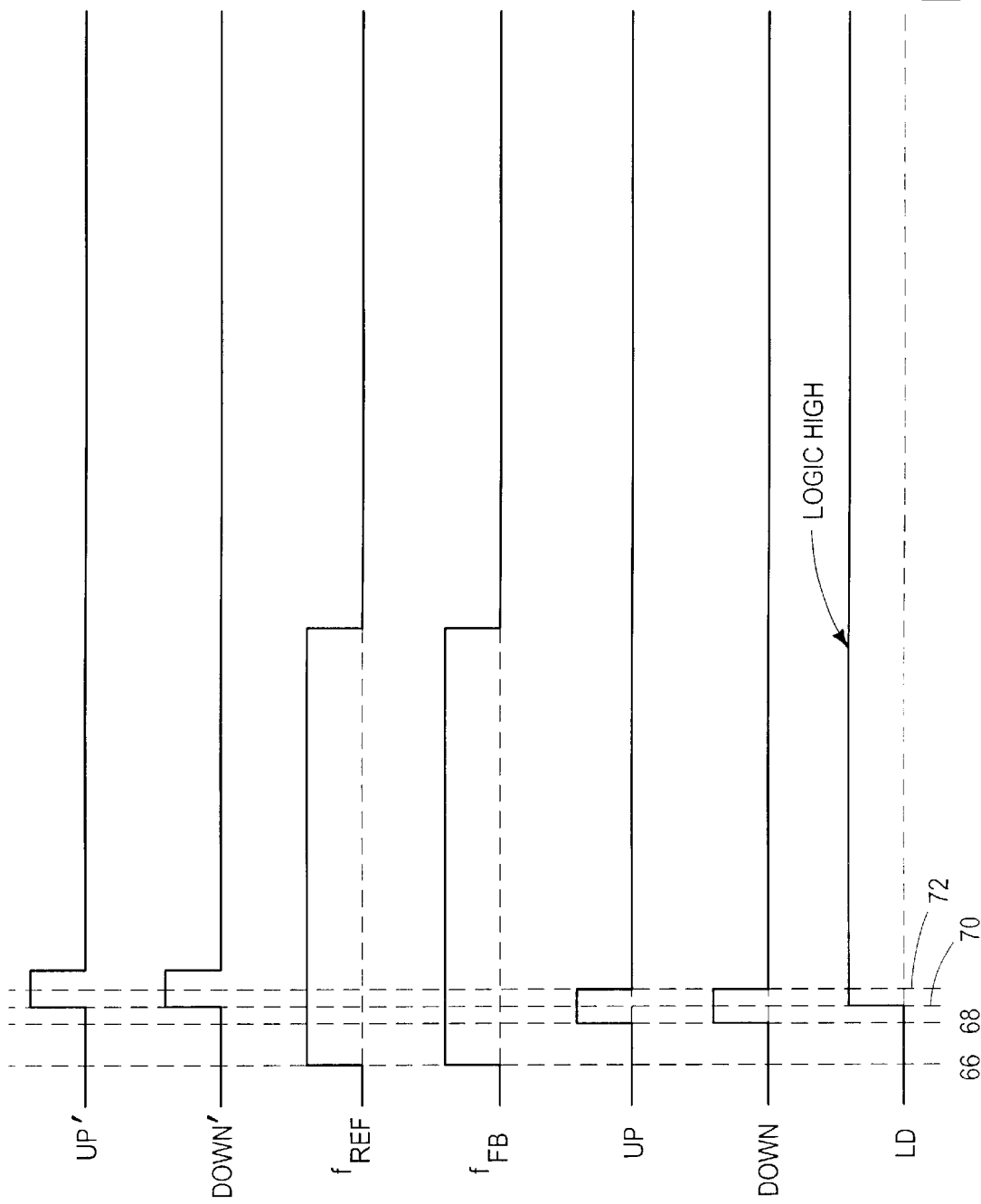
FIG. 5 is a timing diagram depicting a lock detect state of a phase locked PLL.

The timing diagram of zone 3 is illustrated in FIG. 5. The rising edge of fFB occurs at time 66. The phase of $f_{REF}$ is aligned with the phase of $f_{FB}$ such that the rising edge of $f_{REF}$ occurs at time 66. The rising edge of the UP and DOWN pulses occur at time 68 when accounting for the propagation delay through flip flop 16 and 18, respectively. Accounting for the propagation delay through flip flop 18, the rising edge of the CLK input to flip flop 18 asserts the Q output, DOWN pulse, of flip flop 18 at time 68 as shown in FIG. 5. Likewise, accounting for the propagation delay through asynchronous flip flop 16, the CLK input to flip flop 16 asserts the Q output, UP pulse, of flip flop 16 at time 68 as shown in FIG. 5. The propagation delay of AND gate 20 is considered at time 72. The difference between time 68 and time 72 depicts the propagation delay through AND gate 20. Since both inputs to AND gate 20, UP pulse and DOWN pulse, are high at time 68, the output of AND gate 20 transitions to a logic high, one propagation delay after time 68 at time 72. The outputs of flip flop 16 and 18 transition to a logic low at time 72, due to the output of AND gate 20 transitioning to a logic high at time 72 and resetting the output of flip flops 16 and 18. The reset propagation delay through flip flops 16 and 18 is neglected.

Referring to FIG. 5, the DOWN pulse at the D input to flip flop 42 is asserted before the UP' pulse arrives at the CLK input to flip flop 42 and remains asserted long enough to be clocked through flip flop 42 to the Q output. The Q output of flip flop 42 sets the first input to AND gate 44 to a logic high potential.

Likewise, the UP pulse at the D input to flip flop 40 is asserted before the DOWN' pulse arrives at the CLK input to flip flop 40 and remains asserted long enough to be clocked through flip flop 40 to the Q output. The Q output of flip flop 42 sets the second input to AND gate 44 to a logic high potential. Since both inputs to AND gate 44 are at a logic high potential, the output of AND gate 44 transitions to a logic high potential, asserting the lock detect signal at terminal LD. The timing diagram of zone 3 illustrates the condition where the reference signal $f_{REF}$ and the feedback signal $f_{FB}$ are substantially phase aligned. Phase alignment as shown in FIG. 5, within approximately 5–15%, is the only phase relationship which asserts the lock detect signal at terminal LD.

Lock detection circuit 14 provides a distinct speed advantage due to the differential gating used to implement buffers 36 and 38, flip flops 40 and 42 and AND gate 44. Maximum frequency operation of lock detect circuit 14 is, for example, on the order of 2 GHZ. Lock detect circuit 14 accurately detects the condition where the UP and DOWN pulses of a three state PFD are substantially phase aligned. Lock detect circuit 14, for example, asserts the lock detect signal only when the phase of the UP and DOWN pulse trains are within approximately 5–15% (18–54 degrees) of the full scale phase deviation $\theta_{full\ scale}=2\pi$ radians or 360 degrees. In other words, for example, lock detect 14 only reports lock detection when the phase of the UP and DOWN pulse trains are between 36 degrees, corresponding to a 10% phase error, of phase alignment and reports an out of lock condition for all other phase relationships between the UP and DOWN pulse trains.

By now it should be appreciated that a lock detect circuit for a three state PFD and a method for operating the lock detect circuit have been provided. An advantage of lock detect 14 is that it provides increased frequency of operation at increased accuracy. Lock detect circuit 14 is capable of reporting the phase lock state of the PLL by monitoring the UP and DOWN pulses. The lock state of the PLL is reported for each cycle of $f_{REF}$ and $f_{FB}$ and is therefore able to report a real time lock detect state.

What is claimed is:

1. A three state phase frequency lock detection circuit, comprising;
    a phase detector;
    a first memory storage device coupled to a first output of the phase detector for receiving a first signal indicative of a first phase;
    a second memory storage device coupled to a second output of the phase detector for receiving a second signal indicative of a second phase; and
    a logic circuit coupled to receive an output of the first and second memory storage devices and coupled to provide a logic signal indicating that the phase of the first and second signals are substantially equivalent.

2. The three state phase frequency lock detection circuit of claim 1 wherein the first memory storage device includes a positive edge triggered D-type flip flop having a first input coupled to receive the first signal, a second input coupled to receive the second signal and having an output coupled to provide a third signal representative of the first signal enabled by the second signal.

3. The three state phase frequency lock detection circuit of claim 1 wherein the second memory storage device includes a positive edge triggered D-type flip flop having a first input coupled to receive the second signal, a second input coupled to receive the first signal and having an output coupled to provide a fourth signal representative of the second signal enabled by the first signal.

4. The three state phase frequency lock detection circuit of claim 1 wherein the logic circuit includes an AND gate having a first input coupled to receive the third signal and a second input coupled to receive the fourth signal.

5. A lock detect circuit providing a phase alignment status indication between a first data signal and a second data signal, comprising:

a phase detector having first and second inputs for receiving the first and second data signals;

a first memory storage device having a first input coupled to a first output of the phase detector and a second input coupled to a second output of the phase detector;

a second memory storage device having a first input coupled to the second output of the phase detector and a second input coupled to the first output of the phase detector; and a logic circuit coupled to received the outputs of the first and second memory storage devices and having an output coupled to provide a logic signal indicative of the phase alignment status.

6. The lock detect circuit of claim 5 wherein the first memory storage device includes a positive edge triggered D-type flip flop having an output coupled to provide an output signal representing the first data signal enabled by the first clock signal.

7. The lock detect circuit of claim 5 wherein the second memory storage device includes a positive edge triggered D-type flip flop having an output coupled to provide an output signal representing the second data signal enabled by the second clock signal.

8. The lock detect circuit of claim 5 wherein the logic circuit includes an AND gate.

9. A three state phase frequency lock detection circuit, comprising:

a first memory storage circuit having a first input coupled to receive a first phase detector signal and a second input coupled to receive a second phase detector signal; wherein the first memory storage circuit further comprises a buffer having an input coupled to receive the first data signal, and a memory storage device having a first input coupled to receive the second data signal and a second input coupled to receive an output of the buffer;

a second memory storage circuit having a first input coupled to receive the second phase detector signal and a second input coupled to receive the first phase detector signal; wherein the second memory storage circuit further comprises a buffer having an input coupled to receive the second data signal, and a memory storage device having a first input coupled to receive the first data signal and a second input coupled to receive an output of the buffer; and a logic circuit having a first input coupled to receive an output of the first memory storage circuit and a second input coupled to receive an output of the second memory storage circuit.

10. The lock detect circuit of claim 9 wherein the memory storage device includes a positive edge triggered D-type flip flop.

11. The lock detect circuit of claim 9 wherein the memory storage device includes a positive edge triggered D-type flip flop.

12. A method of operating a three state phase frequency lock detection circuit, comprising:

comparing first and second signals to produce firstand second phase detected signals;

storing the first phase detected signal on a transition of the second phase detected signal as a first stored signal;

storing the second phase detected signal on a transition of the first phase detected signal as a second stored signal; and comparing the first and second stored signals to provide a lock detection signal when the first and second signals are substantially operating at the same phase.

13. The method of claim 12 wherein comparing the phase difference between the first and second signals includes:

providing the first signal to a first memory storage device;

providing the second signal to a second memory storage device;

extracting the first signal from the first memory storage device enabled by the second signal; and extracting the second signal from the second memory storage device enabled by the first signal.

* * * * *